United States Patent
White et al.

[11] Patent Number: 5,960,091
[45] Date of Patent: Sep. 28, 1999

[54] ADAPTIVE REMOVAL OF RESONANCE-INDUCED NOISE

[76] Inventors: Stanley A. White, 433 E. Avenida Cordoba, San Clemente, Calif. 92672; Jeffrey P. Woodard, 80 Eaglepoint, Irvine, Calif. 92714; Michael Alan Soderstrand, 2325 Anita Ave., Sacramento, Calif. 95822; Karl Einar Nelson, 403 Russell Park #3, Davis, Calif. 95616; Phong Vu Nguyen Dao, 3840 Vineyard Ave., Apt. B, Pleasanton, Calif. 94566

[21] Appl. No.: 08/846,052

[22] Filed: Apr. 25, 1997

[51] Int. Cl.⁶ .................................................. H03G 5/00
[52] U.S. Cl. ..................... 381/98; 381/94.2; 381/71.8; 364/724.19; 364/724.2
[58] Field of Search ............................. 381/98, 94.3, 71.8, 381/94.2; 364/724.2, 724.19, 724.011; 333/175, 176

[56] References Cited

U.S. PATENT DOCUMENTS 5,491,725  2/1996  White .
5,576,976  11/1996  White .

OTHER PUBLICATIONS

Widrow and Stearns, Adaptive Signal Processing, pp. 250–253, 1985.

*Primary Examiner*—Forester W. Isen
*Attorney, Agent, or Firm*—Charles T. Silberberg; Tom Streeter

[57] ABSTRACT

Noise is removed from the digitized output of a sensor, subject to undesired resonance, even when the resonant frequency is unknown or drifts, with sufficiently low phase delay for the sensor to be used in closed-loop control. A very narrow notch filter which removes the resonance-induced noise is recursive (IIR) and therefore has a low phase delay. However, the apparatus which determines the center frequency of the notch filter is non-recursive, and therefore stable. It includes a tunable FIR filter which tracks the same resonance that we wish the IIR filter to remove. Tuning the FIR filter to minimize the output of the FIR filter therefore tunes the notch frequency to align with the resonant frequency. The tuning parameter which adaptively produces this result is suitably scaled and biased, and is applied to the IIR filter.

7 Claims, 7 Drawing Sheets

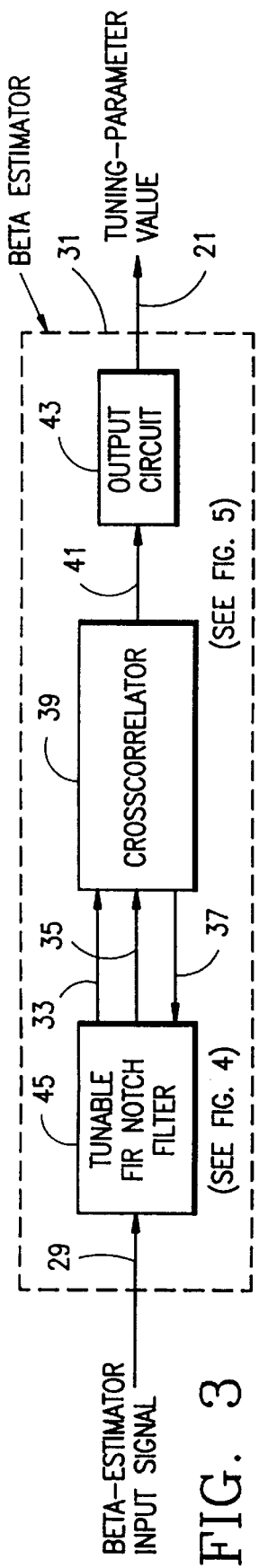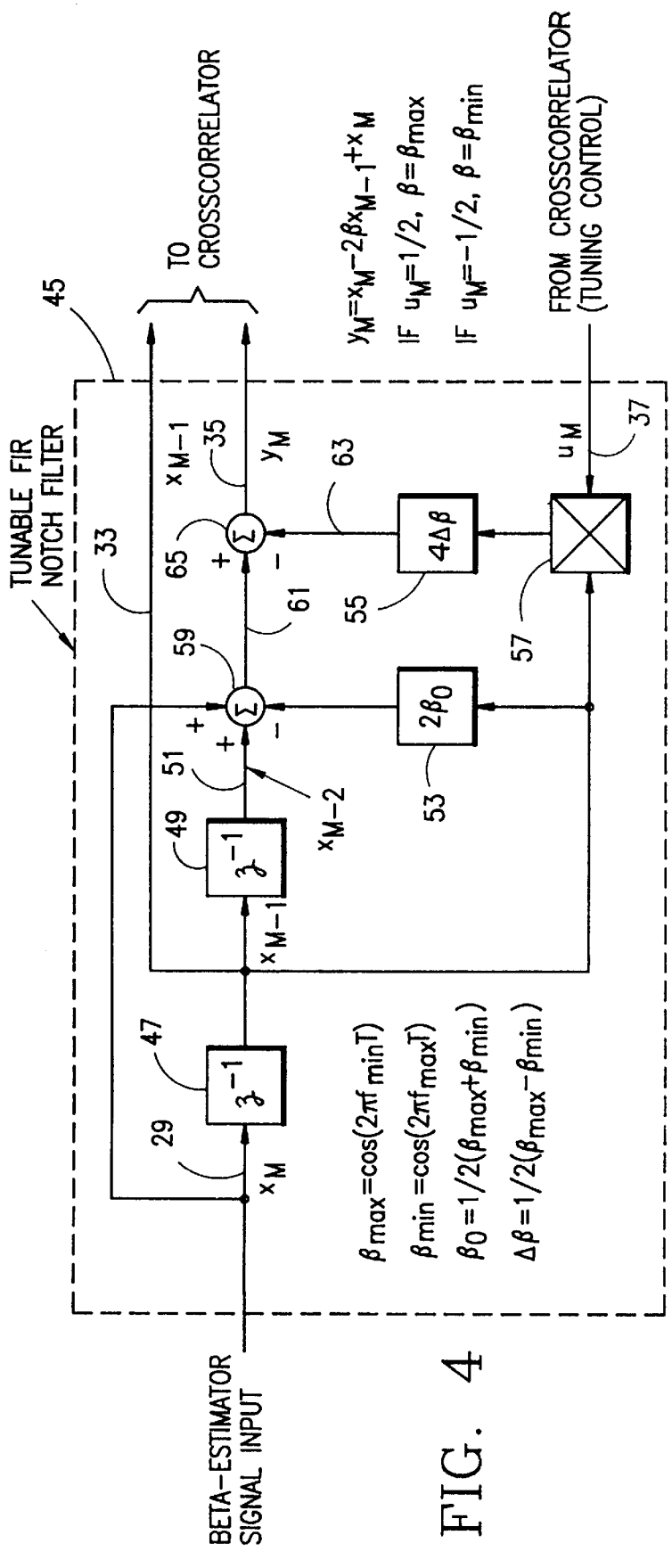

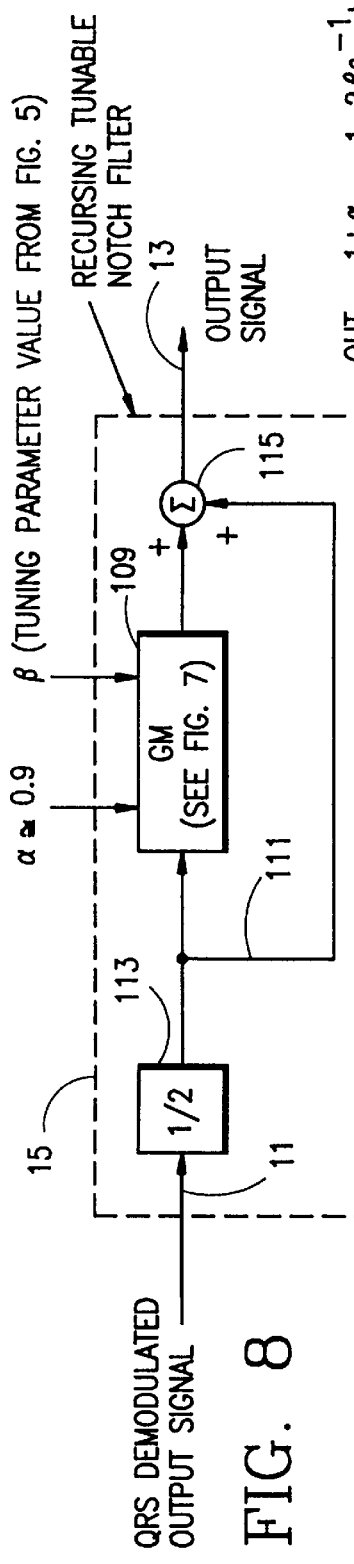
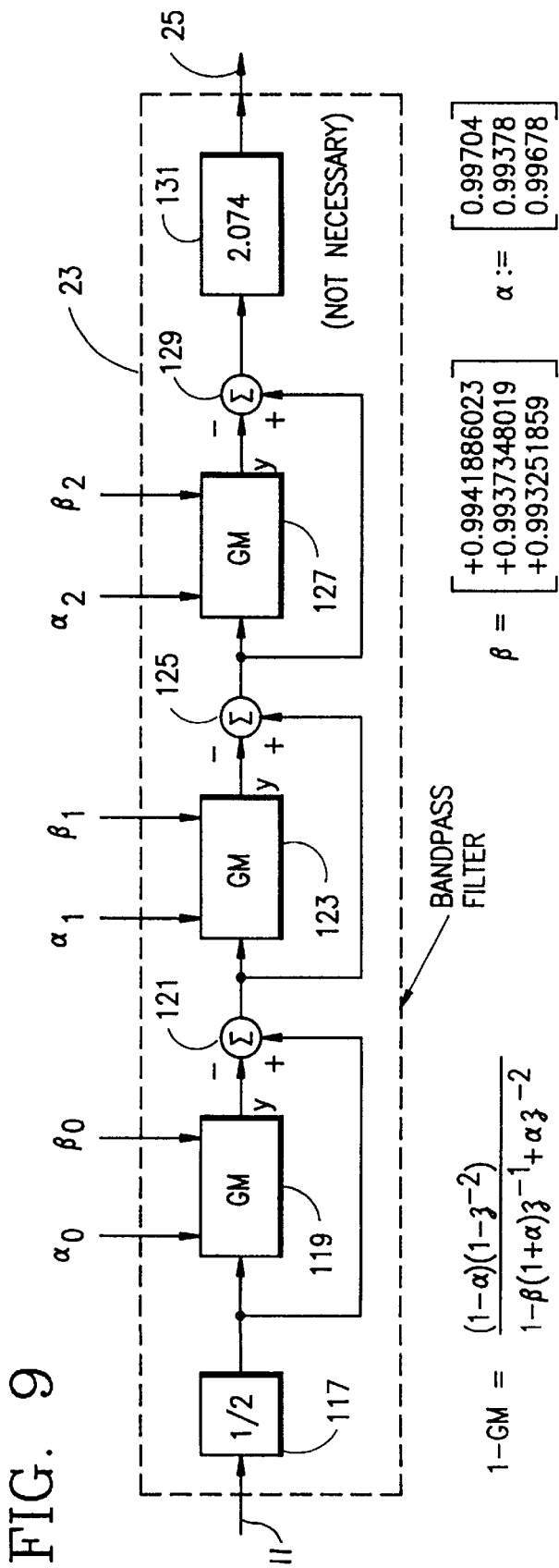

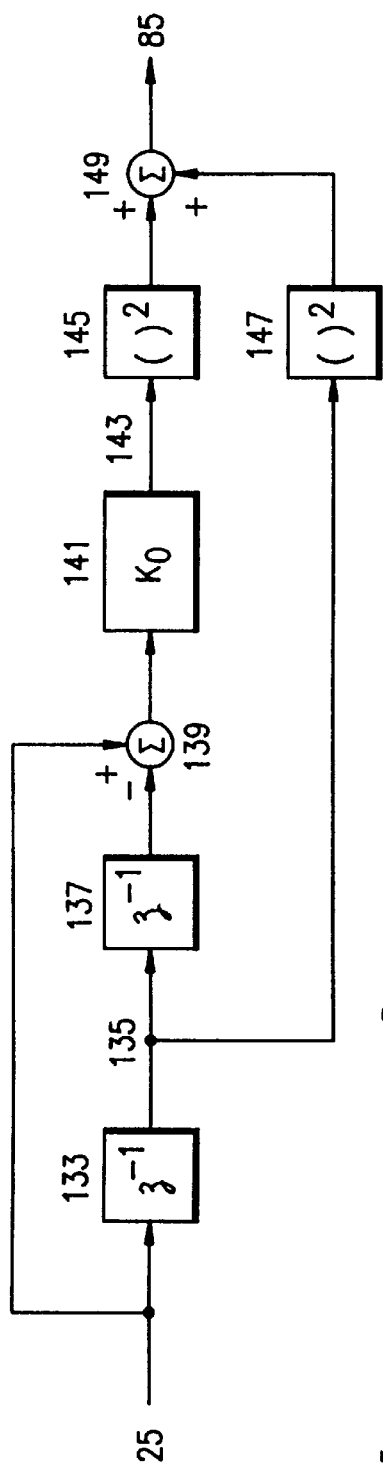
$$K_0 = 1/4 \left[ \csc(2\pi\Delta f_{min}T) + \csc(2\pi\Delta f_{max}T) \right]$$
FIG. 10   NARROWBAND VARIANCE ESTIMATOR
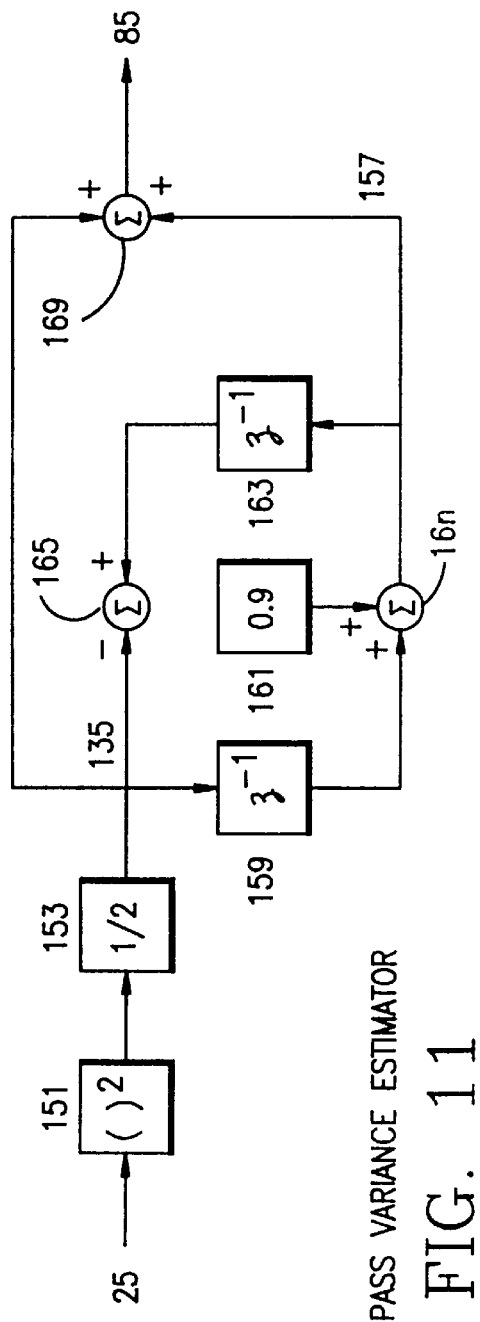
FIG. 11   LOWPASS VARIANCE ESTIMATOR

ALTERNATE NARROWBAND VARIANCE ESTIMATOR

ADAPTIVE REMOVAL OF RESONANCE-INDUCED NOISE

BACKGROUND OF THE INVENTION

This invention relates to removing noise from the digitized output of a sensor, the sensor being subject to undesired (although perhaps necessary) internal or external resonance. It further relates to such removal when the resonant frequency is unknown or drifts.

A popular form of angular rate sensor includes a piezoelectric tuning fork. When the fork is rotated, coriolis forces distort the fork proportionally to the magnitude of the rotation. Effects of resonance of the tuning fork, however, must be removed from the output signal from the fork. This is possible, with a notch filter, if the effect is at a frequency removed from the frequency of interest by an order of magnitude. This is often the case.

In the foregoing example, the resonance is internal to the sensor. It is equally desirable to remove resonance-induced noise from the output of a sensor even when the resonance is external to the sensor. This would occur, for example, in electrical equipment powered by an unstable supply. 60-cycle hum from commercially supplied electricity is easily notched out, but the unstable output of an emergency generator can make its way into a signal to be measured, and is much more difficult to remove. Again, the resonant frequency (and its effect) must be at a frequency somewhat removed from the frequency of interest.

We return to the angular rate sensor with an underlying operating frequency which must be removed from its output signal. This removal is relatively straightforward with a (digital) stagger-tuned notch filter when the frequency range is somewhat known. Stagger-tuned notch filters, however, introduce considerable phase lag.

When the frequency is grossly unknown, unstable, or both, stagger-tuned filters introduce so much phase lag—even at frequencies at some distance below the notch frequency—as to make them unsuitable for an important application: closed-loop control. The solution is to use a very narrow adaptive notch filter, the very narrowness of which greatly reduces phase lag. However, a very narrow notch filter must be an infinite impulse response (IIR) filter; it must be recursive. This in turn makes the adaptive tracking of the notch frequency of the filter unstable: there are many relative minima on the performance-criterion surface. This in turn makes it unsuitable for closed-loop control.

What is needed is an IIR filter to notch out the objectionable resonance with the stable adaptive properties of a non-recursive, finite impulse response (FIR) filter. This problem seems insoluble.

SUMMARY OF THE INVENTION

Applicants have solved the problem by noting a hidden distinction in the statement of the problem. The very narrow notch filter which removes the resonance-induced noise must have a low phase delay and therefore must be recursive. However, the apparatus which determines the center frequency of the notch filter may be non-recursive, and therefore stable.

This center-frequency apparatus includes a tunable FIR filter which tracks the same resonance that we wish the IIR filter to remove; that is, the numerator of its transfer function has zeroes at the same values. Most of the energy of the input signal is in the resonant noise, not the measurement of the parameter. Tuning the FIR filter to minimize the output of the FIR filter therefore tunes the notch frequency to align with the resonant frequency. The tuning parameter which adaptively produces this result is suitably scaled and biased, and is applied to the IIR filter, the numerator of whose transfer function is precisely the same as that of the transfer function of the FIR filter. Because the tuning parameter was adaptively generated in an FIR filter, it is stable. Because it is applied to an IIR filter to filter the raw output of the sensor, the raw output is filtered without significant phase delay.

The foregoing assumes that the resonant frequency, to be notched out, drifts relatively slowly. This is usually the case. If the resonant frequency drifts rapidly, then the phase delay inherent in the emulating FIR filter will not allow the tuning parameter to drift quickly enough to follow it. If this happens, unacceptably large amounts of resonant frequency noise will be passed by the IIR filter. The present invention should not be used in such situations.

BRIEF DESCRIPTION OF THE DRAWINGS

FIG. 3 shows the details of the beta estimator of FIG. 2: a tunable finite impulse response (FIR) notch filter, a cross-correlator, and an output circuit.

FIG. 4 is a digital block diagram of the tunable FIR notch filter of FIG. 3.

FIG. 8 shows the recursive tunable notch filter of FIG. 1, including a GM.

FIG. 9 shows the bandpass filter of FIG. 2, made of GM sections.

FIGS. 10, 11, and 12 show three different embodiments of the variance estimator of FIG. 6.

DETAILED DESCRIPTION OF THE DRAWINGS

Overall View of the Invention

Figure 1:
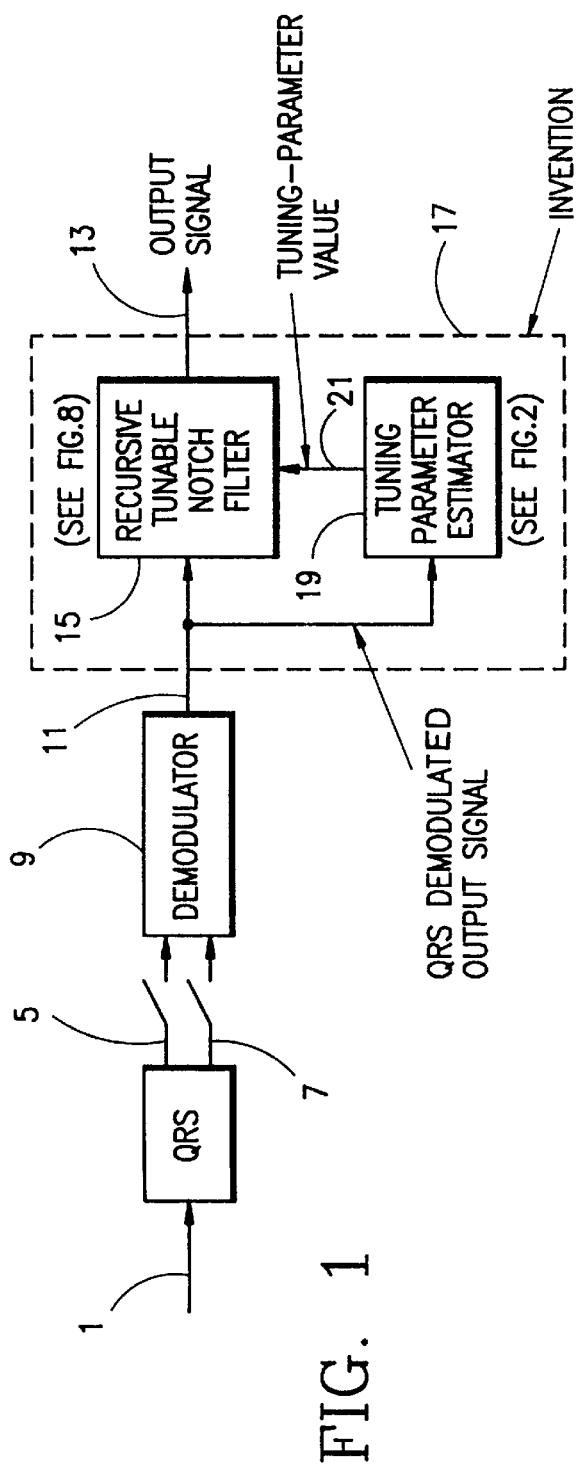
FIG. 1 is a schematic of an angular-rate measurement system in which the output of a quartz rate sensor (QRS) is sampled, digitally demodulated, and applied to the present invention: a recursive tunable notch filter and a tuning parameter estimator.

FIG. 1 is a schematic of an angular-rate measurement system in which the output of a quartz rate sensor (QRS) 3 is sampled 5, 7, digitally demodulated 9, and applied to the present invention 17: a recursive tunable notch filter 15 and a tuning parameter estimator 19. A rotational body rate 1 is detected by a high-Q quartz rate sensor (QRS) 3. QRS 3 produces a double-sideband suppressed-carrier rate output signal 5, which contains a large component of resonance-induced noise. QRS 3 also produces a reference signal 7 suitable for demodulating the rate output signal 5. Both signals 5, 7 are sampled at a rate T (or, equivalently, a sampling frequency f(s)) and digitally demodulated in demodulator 9. Demodulator 9 produces a QRS demodulated output signal 11.

Co-applicant White has done extensive research on the QRS, and is applicant or co-applicant of the following applications and patents, the disclosures of which are hereby incorporated herein by reference:

Applications:

| Serial Number | Title | File Date |
|---|---|---|
| 08/120,871 | Amplitude Detection and Automatic Gain Control of a Sparsely Sampled Sinusoid by Computation Including a Hilbert Transform | 09/07/93 |
| 08/634,003 | Sawtooth Phase Filter | 04/15/96 |
| 08/636,088 | Measuring Amplitude of Sparsely Sampled Sinusoidal Signal | 04/22/96 |
| 08/676,653 | Decimating IIR Filter | 07/08/96 |
| 08/683,643 | Adaptive Phase-Shift Adjuster for Resonator | 07/15/96 |

Patents:

| Patent Number | Title | Issue Date |
|---|---|---|
| 5,179,380 | One-Bit Sigma-Delta Modulator with Improved Signal Stability | 01/12/93 |
| 5,339,263 | Decimator/Interpolator Filter for ADC and DAC | 08/16/94 |
| 5,361,036 | Complex Digital Demodulator Employing Chebychev-Approximation Derived Synthetic-Sinusoid Generator | 11/01/94 |
| 5,400,269 | Closed-Loop Baseband Controller for a Rebalance Loop of a Quartz Angular-Rate Sensor | 03/21/95 |
| 5,444,639 | Angular-Rate-Sensing System and Method with Digital Synthesizer and Variable-Frequency Oscillator | 08/22/95 |
| 5,444,641 | Admittance-Parameter Estimator for a Piezoelectric Resonator in an Oscillator Circuit | 08/22/95 |
| 5,459,432 | Use of a Chopper and a Sigma-Delta Modulator for Downconverting and Digitizing an Analog Signal Including Information Modulated by a Carrier | 10/17/95 |
| 5,463,575 | Reduced Quantization Noise from a Single-Precision Multiplier | 10/31/95 |
| 5,471,396 | Estimator of Amplitude and Frequency of a Noisy Biased Sinusoid from a Short Burst of Samples | 11/28/95 |
| 5,487,015 | Self-Oscillating Driver circuit for a Quartz Resonator of an Angular-Rate Sensor | 01/23/96 |
| 5,491,725 | A Tracking Filter and Quadrature Phase-Reference Generator | 02/13/96 |
| 5,550,866 | A Demodulator/Reference Generator Based on Two Cascaded Hilbert Transformers | 08/27/96 |
| 5,566,093 | Sensor with Resonator, Digital Filter, and Display | 10/15/96 |
| 5,576,976 | Amplitude Detection and Automatic Gain Control of a Sparsely Sampled Sinusoid by Adjustment of a Notch Filter | 11/19/96 |
| 5,577,073 | A Frequency and Phase-Locked Two-Phase Digital Synthesizer | 11/19/96 |

All other references cited herein are also incorporated herein by reference.

Output signal 11 is often rendered useless because of a large resonance noise component included from double-sideband suppressed-carrier rate output signal 5. The frequency of the resonance noise drifts. Output signal 11 is therefore applied to a tunable notch filter 15, which can remove the resonance if it is driven by a tuning-parameter value which is fixed or suitably programmed. The notch filter 15 is recursive, to provide low phase shift. The present invention 17 combines the recursive tunable notch filter 15 with an automatic tuning-parameter estimator 19. The output 21 of the estimator 19 is an estimate of the tuning-parameter beta needed to correctly tune the recursive tunable notch filter 15

Tuning Parameter Estimator

Figure 2:
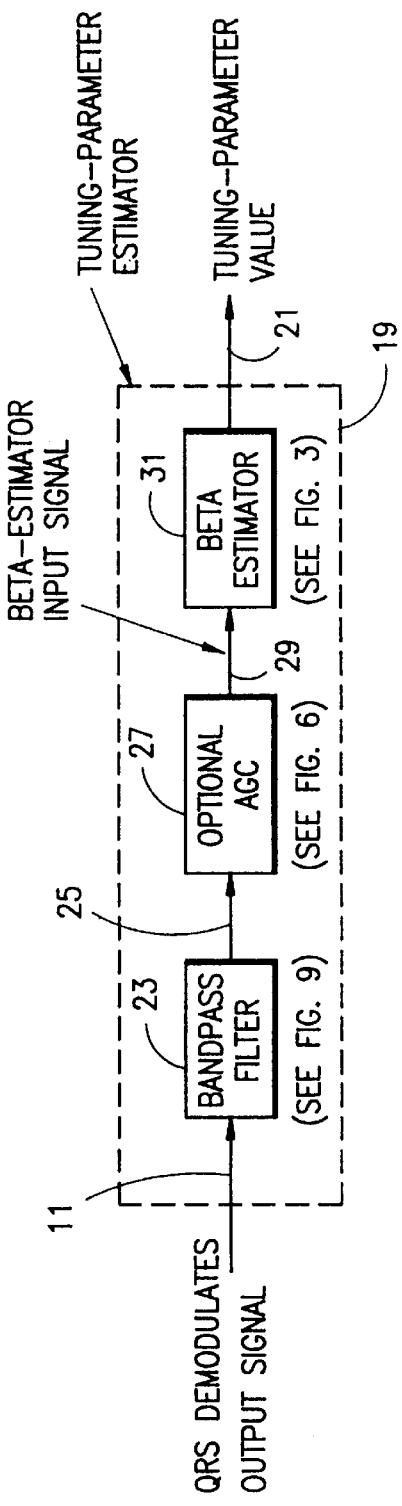
FIG. 2 shows the details of the tuning parameter estimator of FIG. 1: a bandpass filter, an optional automatic gain control (AGC), and a beta estimator.

FIG. 2 shows the details of the tuning parameter estimator of FIG. 1: a bandpass filter 23, an optional automatic gain control (AGC) 27, and a beta estimator 31. The input 11 to the tuning-parameter estimator 19 is the QRS demodulated output signal. This signal 11 contains the objectionable resonance noise as well as the information signal and a complex noise structure. The frequency of the resonance noise is known to lie between a maximum frequency f(max) and a minimum frequency f(min), and the frequency of the information signal is known to lie outside these limits. Bandpass filter 23 is therefore constructed to pass signals within this frequency band, and to reject all others. The bandpass filter output signal 25 is therefore dominated by the resonance noise. Automatic Gain Control (AGC) 27 adjusts the amplitude of the resonance noise so that its output 29 lies in the most effective amplitude range for achieving a fast and accurate response from the beta estimator 31. The output 21 of the beta estimator 31 is the previously discussed output of the tuning parameter estimator 19. This is the sought-after tuning parameter value for the recursive tunable notch filter 15.

Beta Estimator

FIG. 3 shows the details of the beta estimator 31 of FIG. 2: a tunable finite impulse response (FIR) notch filter 45, a cross-correlator 39, and an output circuit 43. The beta-estimator input signal 29 drives the tunable FIR notch filter 45. The filter 45 has two outputs: delayed output 33 and notch filter output 35. If the filter 45 is properly tuned by the feedback tuning signal 37 from the cross-correlator 39, then the energy of the notch-filter output 35 should be very small. The output 41 from the cross-correlator 39 is the same as the feedback tuning signal 37, but instead drives the output circuit 43. Output circuit 43 in turn biases and scales the cross-correlator output signal 41 to form the tuning-parameter value 21.

Tunable FIR Notch Filter

FIG. 4 is a digital block diagram of the tunable FIR non-recursive digital notch filter 45 of FIG. 3. It includes two scaling elements 53 and 55, the coefficients for which are based on an FIR filter operating range from f(min) to f(max). This is preferably also the passband of passband filter 23. It is further preferred that this range closely approximate the frequency range of the resonance noise. If this is done, then the full dynamic range of the components can be exploited, which is especially desirable when fixed-point arithmetic components are used (as is preferred).

All that is necessary, however, is that the FIR filter operating range completely include the noise range, and that the passband filter's passband also completely include the noise range. If additional frequencies, overlapping or not, are included in FIR filter operating range, or the passband, then the apparatus will still function, but not as accurately (especially with fixed-point devices).

What is vital is that coefficients of the output circuit 43 (see also FIG. 5) be based on the operating range of FIR filter 45, and not the passband of passband filter 23. The FIR notch center frequency of FIR filter 45 is based on its operating range, determined by the coefficients of multipliers 53, 55 and the value of control signal 37 from cross-correlator 39, and not on the range of signals 29 which are applied to it, whether directly or through a passband filter.

AGC 27 is optional since its presence does not affect the notch frequency of the FIR filter 45. Instead, its presence allows the fixed-point arithmetic devices to exploit their full range, without either overflow or underflow. If floating-point devices are use, AGC 27 becomes less necessary.

In FIG. 4, the beta estimator input signal 29, x(n), feeds first delay element 47 to produce a singly-delayed signal 33, x(n−1), which in turn feeds second delay element 49 to produce a doubly-delayed signal 51, x(n−2).
Adder/subtracter 59 forms the sum $$x(n)+x(n-2).$$

First scaler 53 produces the product $$x(n-1)*2*BETA(0),$$

and adder/subtracter 59 also subtracts this product from the previously mentioned sum $$x(n)+x(n-2),$$

the difference being the output 61 of adder/subtracter 59. Let $$BETA(0)=(\tfrac{1}{2})*[BETA(max)+BETA(min)],$$

where $$BETA(max)=cos(2*PI*f(min)*T),$$

and $$BETA(min)=cos(2*PI*f(max)*T).$$

Thus, BETA(0) is a mid-point estimate of the BETA which is to be applied to IIR filter 15 to set the notch frequency of IIR filter 15. First scaler 53 thus scales x(n−1) by a first coefficient equal to approximately twice the BETA coefficient of the IIR filter 15. Output 61 is thus seen to be the output of an FIR notch filter when tuned to BETA(0).

Actual tuning of the tunable notch filter 45 is accomplished by manipulating DELTA BETA, where $$DELTA\ BETA=\tfrac{1}{2}*[BETA(max)-BETA(min)].$$

DELTA BETA is thus seen as the half-width of the range of the BETAs to be applied to the IIR 15. DELTA BETA is exploited by a control signal u(n), 37, which is received from the cross-correlator 39. Control signal 37 is the cross-correlation coefficient between singly-delayed input signal 33 and FIR output signal 35, and is constructed to fall between −½ and +½. It represents the true coefficient plus an error measure, which is adaptively driven to zero. Singly-delayed signal x(n−1), 33, and control signal u(n), 37, are multiplied together in first multiplier 57, the product of which is multiplied by $$4*(DELTA\ BETA)$$

in second scaler 55. Thus, u(n)*x(n−1) is multiplied by a second coefficient equal to twice the expected range of the BETA coefficient of the IIR 15. The product 63, $$u(n)*x(n-1)*4*(DELTA\ BETA),$$

of multiplier 55 is subtracted from output 61 in subtracter 65, thereby producing output 35, y(n), the FIR output signal. Thus, $$y(n)=x(n)-2*BETA*x(n-1)+x(n),$$

where $$BETA=BETA(0)+2*(DELTA\ BETA)*u(n).$$

Note that, $$when\ u(n)=\tfrac{1}{2},\ BETA=BETA(max),$$

and that, $$when\ u(n)=-\tfrac{1}{2},\ BETA=BETA(min).$$

Control signal u(n), 37, is manipulated through DELTA BETA, rather than through BETA itself, because DELTA BETA has such a smaller magnitude. This topology greatly reduces the effects of round-off error from the digitizing process. These effects are especially pronounced when fixed-point arithmetic devices are used, as is preferred, since they are smaller, cheaper, lighter, and more power miserly. Even when floating-point devices are used, however, this topology reduces the output errors which occur when enough round off errors align simultaneously.

The transfer function of the FIR filter 45 is readily determined.

For $-\tfrac{1}{2}<u(n)<\tfrac{1}{2}$, $$y(n)=x(n)+x(n-2)-x(n-1)[2*BETA(0)+4*(DELTA\ BETA)*u(n)],$$

or $$y(n)=x(n)+x(n-2)-x(n-1)*2*[BETA(0)+2*(DELTA\ BETA)*u(n)],$$

or $$y(n)=x(n)+x(n-2)-x(n-1)*2*[BETA].$$

Thus, $$Y(z)=X(z)+z\hat{\ }(-2)X(z)-2z\hat{\ }(-1)X(z)BETA,$$

or $$Y(z)/X(z)=1-2z\hat{\ }(-1)BETA+z\hat{\ }(-2).$$

This is identical to the numerator of the transfer function of the IIR filter 15 of FIG. 8 (see also FIG. 1), which is what we want.

Cross-Correlator

Figure 5:
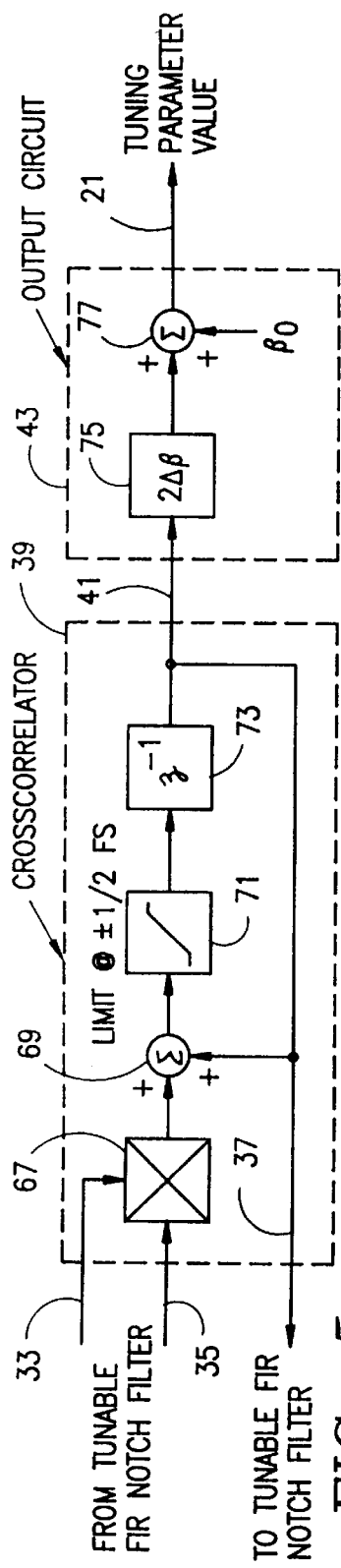
FIG. 5 is a digital block diagram of the cross-correlator and the output circuit of FIG. 3.

FIG. 5 is a digital block diagram of the cross-correlator 39 and the output circuit of FIG. 3. Cross-correlator 39 exists to produce control signal u(n), 37, in such a fashion that, when applied to the tunable FIR notch filter 45, the filter's output y(n), 35, will have minimum power. The control law for control signal u(n), 37, is obtained by invoking the steep descent law. Under the steep descent law, the rate of adjustment of u(n) is made proportional to the partial derivative of the unbiased estimate of the output power E(y(n)squared)

with respect to u(n). This is the well-known LMS criterion, popularized by Widrow. See B. Widrow and J. M. McCool, "A comparison of adaptive algorithms based on the methods of steepest descent and random search," *IEEE Trans. Antennas Propag.*, vol. AP-24, no. 5, pp. 615–637, September 1976; B. Widrow, J. M. McCool, M. G. Larimore, and C. R. Johnson, Jr., "Stationary and nonstationary learning characteristics of the LMS adaptive filter," *Proc. IEEE*, vol. 64, no. 8, pp. 1151–1162, August 1976; B. Widrow et al., "Adaptive noise canceling; principles and applications," *Proc. IEEE*, vol. 63, no. 12, pp. 1692–1716, December 1975; B. Widrow, "Adaptive Filters," in *Aspects of Network and System Theory*, R. E. Kalmas and N. De Claris (Eds.), New York: Holt, Rinehart and Winston, 1970, pp. 563–587; and B. Widrow and E. Walach, "On the statistical efficiency of the LMS algorithm with nonstationary inputs," *IEEE Trans. Information Theory—Special Issue on Adaptive Filtering*, vol. 30, no. 2, part 1, pp. 211–221, March 1984.

Cross-correlator 39 is mechanized to invoke this law. Second multiplier 67 forms the product of signals 33 and 35, which is a scaled gradient of the power of the FIR output signal 35 with respect to the tuning control signal 37; that is, it is a partial derivative of an unbiased estimate of the power of the FIR output signal 35. The resulting product is summed with tuning control signal 37 in second adder 69. Limiter 71 limits the output of adder 69 to lie between +½ full scale and −½ full scale. The output of limiter 71, when delayed by third delay element 73, forms the tuning control signal u(n), 37, for the tunable FIR notch filter 45.

Output Circuit

Control signal u(n), 37, is fed back to the tunable FIR notch filter 45. It is also fed forward, as cross-correlator output 41, to drive output circuit 43. Output circuit 43 scales the cross-correlator output 41 by 2*(DELTA BETA) in third scaler 75; that is, it multiplies the control signal 37 by a third coefficient, 2*(DELTA BETA), equal to half the second coefficient, 4*(DELTA BETA). See above, "Tunable FIR Notch Filter", FIG. 4, second scaler 55. It then biases the result by BETA(0) in third adder 77 to produce BETA, the tuning-parameter value 21; that is, it adds the result and a fourth coefficient, BETA(0), which is equal to half the first coefficient, 2*BETA(0). See above, "Tunable FIR Notch Filter", FIG. 4, first scaler 57.

Output circuit 43 thus generates BETA, a function of the control signal 37, which is a linear bias and scale function. This circuit is greatly preferred for its simplicity, although non-linear functions could be used. In any event, the function is selected such that the FIR notch center frequency is the same as the IIR notch center frequency when the control signal 37 is applied to the FIR filter 45 and the function of the control signal 37 is applied to the IIR filter 15.

Output circuit 43 is necessary since the range of the cross-correlator output 37, 41 was determined to allow robust operation of the cross-correlator with finite wordlength arithmetic. Signal 41 ranges from −½ to +½, while the tuning parameter value ranges from BETA(0)−(DELTA BETA) to BETA(0)+(DELTA BETA). The output circuit 43 provides the necessary scaling $$2*(\text{DELTA BETA})=1$$

and $$\text{BETA}(0)=0.$$

This would occur if $$\text{BETA}(\max)=\tfrac{1}{2},$$

that is, $$f(\min)=f(s)/6=1/(6*T),$$

and $$\text{BETA}(\min)=-\tfrac{1}{2},$$

that is, $$f(\max)=f(s)/3=1/(3*T).$$

This would also eliminate the signal path through scaler 53, and would replace scaler 55 with a doubler. This simplification is not preferred, since it imposes severe restrictions on the range of resonance frequencies which can be notched out. The identity function thus produced, while undesirable, is the simplest possible linear bias and scale function.

Automatic Gain Control

Figure 6:
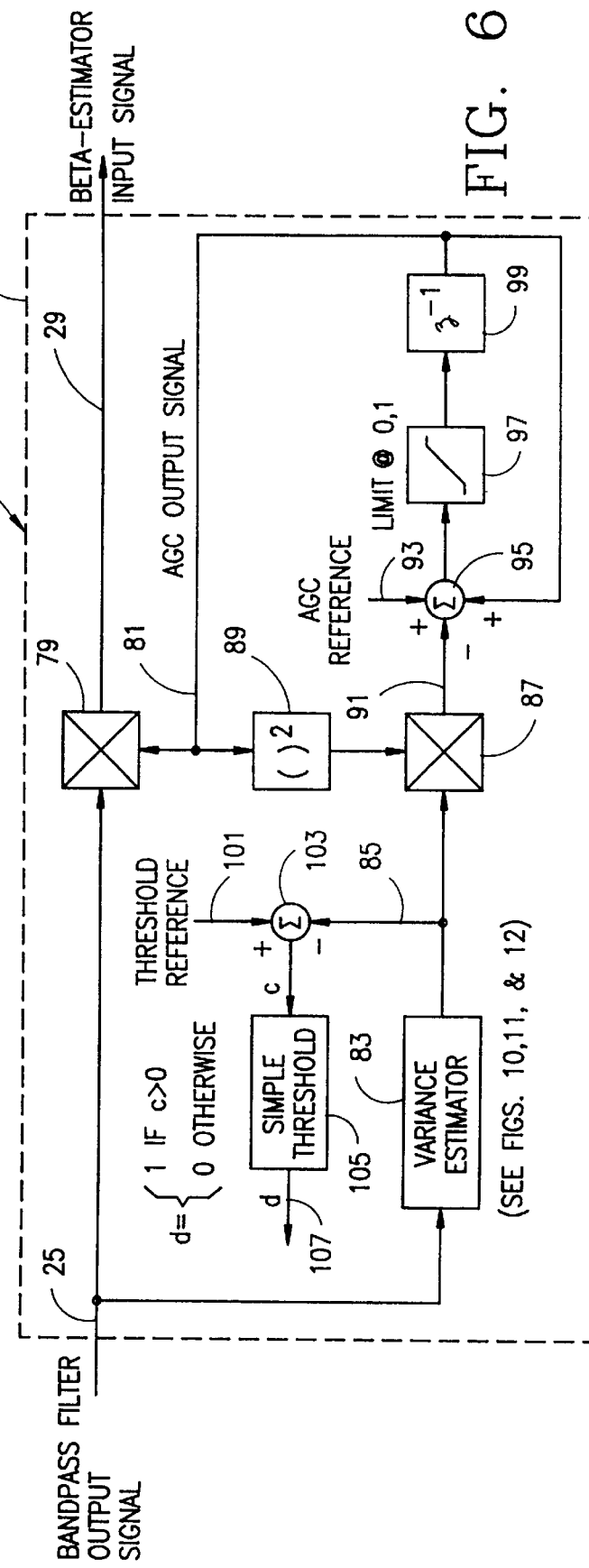
FIG. 6 is a digital block diagram of the AGC of FIG. 2, including a variance estimator.

FIG. 6 is a digital block diagram of the AGC of FIG. 2, including a variance estimator 83. Multiplier 79 scales the bandpass filter output signal 25 by AGC output signal 81 to produce the beta-estimator input signal 29. Variance estimator 83 provides an estimate 85 of the variance of the bandpass filter output signal 25. This variance estimate 85 is put to two uses.

In the first use, multiplier 89 squares the AGC output signal 81, and multiplier 87 multiplies this square by the variance estimate 85. The resulting product 91 is an estimate of the variance of the beta-estimator input signal 29. Adder/subtracter 95 takes the product 91 and subtracts it from the sum of the AGC reference value 93 and the AGC output signal 81. Limiter 97 limits the result to lie between 0 and 1, and delay element 99 delays the limited result to for the AGC output signal 81.

The AGC reference value 93 is the target value of the variance of the beta-estimator input signal 29. Since estimated variance signal 91 estimates the variance of input signal 29, the difference formed in the adder/subtracter 95 is an estimate of the error in setting the input signal 29 to the proper power level. Such an error would be due to an error in setting the AGC output signal 81. The AGC output signal 81 is therefore driven to minimize the variance error. The AGC reference value 93 is predetermined from the nature of the sensor output to be filtered, the size of the registers of the arithmetic units which mechanize the filter, and the like, as determined by the ordinarily skilled worker.

In the second use, a subtracter 103 subtracts the variance estimate 85 from a threshold reference 101. If the difference is positive, that is, if the variance estimate 85 is less than the threshold reference 101, then a logic unit 105 produces a control output 107 of "TRUE". This, in turn, inhibits further operation of (in FIG. 5) the adder 69, and (in FIG. 6) the adder/subtracter 95. The former inhibition freezes the tuning-control signal 37, and thus freezes the zeroes of the tunable FIR notch filter 45 (FIG. 3). The latter inhibition freezes the AGC output signal 81, and allows the bandpass filter 23 to drive the beta estimator 31 as though the AGC 27 were a simple scaler.

When the variance estimate 85 is this low, this indicates that the error between the notch center frequency and the resonance noise center frequency is so small that the IIR 15 should be kept as it is. It can also indicate that the signal levels are so low that no meaningful adaptation is possible.

Gray-Markel Filter

Figure 7:
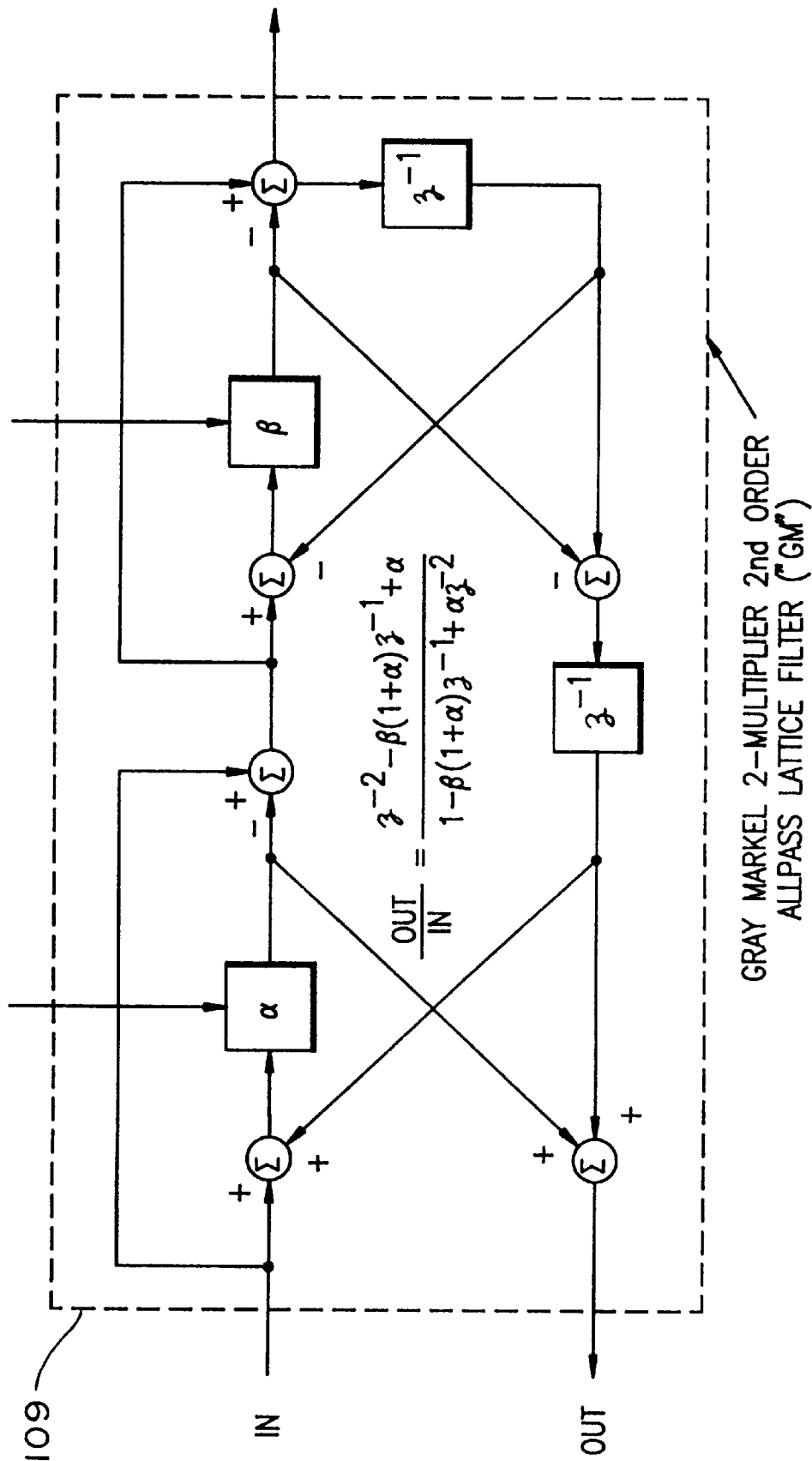
FIG. 7 shows the details of a filter topology used extensively in this invention, a Gray-Markel (GM) second-order two-multiplier recursive allpass lattice filter.

FIG. 7 shows the details of a filter topology used extensively in this invention, a Gray-Markel (GM) second-order two-multiplier allpass recursive lattice filter 109. This filter is entirely conventional, and its transfer function is stated in FIG. 7. It will accordingly not be further discussed. See Gray, et al., "Digital lattice and ladder filter synthesis," *IEEE Trans. on Audio and Electroacoustics,* vol. AU-21, no. 6, pp. 491–500, December 1973.

Recursive (IIR) Tunable Notch Filter

FIG. 8 shows the recursive (IIR) tunable digital notch filter 15 of FIG. 1, including a GM 109. In the GM 109, the ALPHA coefficient is fixed at slightly below 1, and the BETA coefficient is the tuning parameter value 21 from FIG. 5. IIR filter 15 has an IIR notch center frequency which is tunable in response to BETA. A third multiplier 113 prevents overflow by one-half scaling the input signal 11 to an intermediate signal 111, which is applied both to the GM 109 and to a first adder 115. The output of the GM 109 is also applied to the adder 115, the output 13 of which is the output signal of the IIR 15. The transfer function of the IIR 15 is stated in FIG. 8, and represents a very deep and narrow notch filter with a very low phase delay at lower frequencies.

Bandpass Filter

FIG. 9 shows the bandpass filter of FIG. 2, made of cascaded GM sections 119, 123, and 127. The sections 119, 123, and 127 are separated by subtracters 121, 125, and 129, each of which subtracts a GM filter output from its input. A one-half scaler 117 receives the input signal 11, and parallels the one-half scaler 113 of FIG. 8, and likewise prevents overflow. An output multiplier 131 restores the gain in the center of the passband to unity. The multiplier 113 may be omitted if, as is preferred, the AGC 27 (see FIG. 2) provides full dynamic range to the beta estimator 31. The transfer function, and suitable values for the ALPHA and BETA of each section, are shown in FIG. 9. This is the preferred form of bandpass filter, but any form of bandpass filter may be used which is wide enough to admit substantially all of the noise to be notched out, yet narrow enough to exclude the information signal.

Variance Estimators

Figure 12:
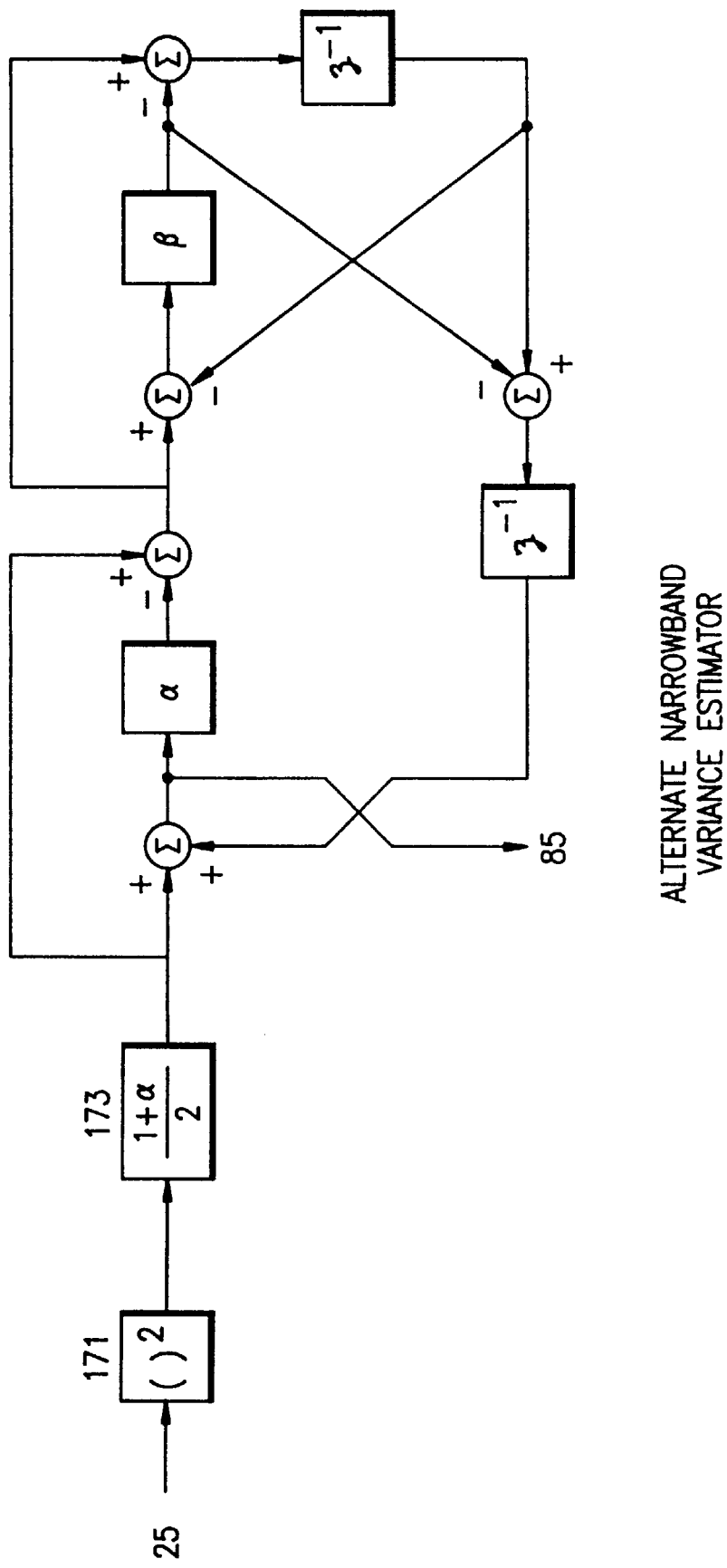

FIGS. 10, 11, and 12 show three different embodiments of the variance estimator of FIG. 6. Others will occur to those having skill in the art.

FIG. 10 shows a narrowband variance estimator. Input 25 drives a pair of cascaded delay elements 133, 137. Subtracter 139 subtracts the output of cascaded delay elements 133, 137 from the input 25. Scaler 141 multiplies the output of subtracter 139 by $$K(0)=(\tfrac{1}{4})*(\csc[2*PI*F(\min)*T]+\csc[2*PI*F(\max)*T]),$$

and produces output 143. Elements 133, 137, 139, and 141 comprise the quadrature-phase channel of a narrowband Hilbert transformer, which transforms input signal 25 to Q (imaginary) output signal 143. The in-phase I (real) output signal is taken from center tap 135 between delay elements 133 and 137. Multiplier 145 squares the Q signal 143, and multiplier 147 squares the I signal from tap 135. Adder 149 adds these squares. This approach works well if there is little noise in the frequency region of the resonance; that is, when the resonance noise is a relatively clean sinusoid.

FIG. 11 shows a lowpass variance estimator that works very robustly, but slowly, in the presence of broadband noise. Slowness of operation is acceptable if the center frequency of the resonance noise drifts relatively slowly, which is often the case. Multiplier 151 squares the input signal 25, and multiplier 153 scales the square by one half against overflow. The output 155 drives a lowpass filter comprising a Mitra-Hirano type 1A(t) allpass filter and an adder 169, which adds together the input 155 and output 157 of the Mitra-Hirano filter. See S. K. Mitra and K. Hirano, "Digital all-pass networks," *IEEE Trans. Circuits and Systems,* vol. CAS-21, no. 5, pp. 688–700, September 1974.

The input 155 of the Mitra-Hirano filter drives a delay element 159 and the minus input of a subtracter 165. The output of subtracter 165 is scaled by a factor slightly less than one (0.9 is preferred) in multiplier 161. An adder 167 adds the outputs of delay element 159 and multiplier 161, and applies the sum 157 to delay element 163, which in turn drives the plus input of subtracter 165. The sum 157 is the output of the Mitra-Hirano filter.

FIG. 12 shows an alternate narrowband variance estimator, tolerant of more noise near the resonance that the narrowband variance estimator of FIG. 10. Multiplier 171 squares the input 25, and multiplier 173 scales the square by a factor of $$(1+ALPHA)/2,$$

where ALPHA is the ALPHA of the follow-on GM filter, that is, $$ALPHA=(1-\tan[PI*f(nw)*T])/(1+\tan[PI*f(nw)*T]),$$

where f(nw) is the −6 dB notch width, in Hz. The result is applied to the GM, but with the output taken just before the GM's ALPHA multiplier. The BETA of the GM filter is tuned to twice the center frequency of the bandpass filter 23, so, to a first approximation, $$BETA=\cos(2*PI*[f(\max)+f(\min)]*T).$$

Alternatively, we could follow squaring multiplier 171 with the notch filter of FIG. 8, again with BETA tuned to twice the center frequency of the bandpass filter 23.

Scope of the Invention

Several specific embodiments of the present invention have been disclosed herein, but the true spirit and scope of the present invention are not limited thereto. Such limitations are imposed only by the appended claims and their equivalents.

What is claimed is:

1. An article of manufacture comprising:
    (a) a recursive digital notch (IIR) filter constructed to receive an input signal and to produce an output signal, the IIR notch center frequency being tunable in response to a function of the control signal recited below;
    (b) a bandpass filter constructed to receive the input signal and to produce a bandpass output signal;

(c) a non-recursive digital notch (FIR) filter constructed to receive the bandpass output signal and to produce an FIR output signal, the FIR notch center frequency being tunable in response to the control signal recited below, and being the same as the IIR notch center frequency when the control signal is applied to the FIR filter and the function of the control signal is applied to the IIR filter; and (d) a control signal generator constructed to generate a control signal which adaptively minimizes the FIR output signal.

2. The article of claim 1, wherein the control signal generator is constructed to adjust the control signal at a rate which is proportional to the partial derivative of an unbiased estimate of the power of the FIR output signal with respect to the control signal.

3. The article of claim 1, wherein the function is a linear bias and scale function with a bias other than zero or a scaling factor other than one.

4. An article of manufacture comprising:

(a) a recursive digital notch (IIR) filter constructed to receive an input signal and to produce an output signal, the IIR notch center frequency being tunable in response to a function of the control signal recited below;

(b) a bandpass filter constructed to receive the input signal and to produce a bandpass output signal;

(c) a non-recursive digital notch (FIR) filter constructed to receive the bandpass output signal and to produce an FIR output signal, the FIR notch center frequency being tunable in response to the control signal recited below, and being the same as the IIR notch center frequency when the control signal is applied to the FIR filter and the function of the control signal is applied to the IIR filter; and (d) a control signal generator constructed to generate a control signal which adaptively minimizes the FIR output signal;

wherein the IIR filter comprises a Gray-Markel filter having a beta coefficient, preceded by a one-half scaler and followed by a first adder connected to add together an input and an output of the Gray-Markel filter, and wherein the FIR filter comprises:

(e) a first delay element connected to receive an input signal to the FIR filter and connected to produce a singly-delayed input signal;

(f) a second delay element connected to receive the singly-delayed input signal and to produce a doubly-delayed signal;

(g) a first scaler connected to receive the singly-delayed input signal and to multiply it by a first coefficient equal to approximately twice the beta coefficient of the IIR filter;

(h) an adder/subtracter connected to add together the input and doubly-delayed signals and to subtract an output of the first scaler;

(i) a first multiplier connected to multiply the singly-delayed input signal and the control signal;

(j) a second scaler connected to receive an output of the multiplier and to multiply it by a second coefficient equal to twice an expected range of the beta coefficient of the IIR; and (k) a subtracter connected to subtract an output of the second scaler from an output of the adder/subtracter, and to produce the FIR output signal.

5. The article of claim 4, wherein the control signal generator comprises:

(a) a second multiplier connected to multiply together the singly-delayed signal and the FIR output signal;

(b) a second adder connected to add together a output of the multiplier and the control signal;

(c) a limiter connected to limit an output of the second adder;

(d) a third delay element connected to delay a output of the limiter, and connected to produce the control signal.

6. The article of claim 4, wherein the control signal generator includes a cross-correlator connected to cross-correlate a delayed version of the input signal and the FIR output signal and to thereby adjust the control signal at a rate which is proportional to the partial derivative of an unbiased estimate of the power of the non-recursive notched signal with respect to the control signal, thereby adaptively minimizing the FIR output signal.

7. The article of claim 6, further comprising an output circuit comprising:

(a) a third scaler connected to multiply the control signal by a third coefficient equal to half the second coefficient;

(b) a third adder connected to add together an output of the third scaler and a fourth coefficient equal to half the first coefficient, and connected to produce the function of the control signal.

* * * * *